(12) United States Patent
Mahanavelu et al.

(10) Patent No.: US 7,456,670 B2
(45) Date of Patent: *Nov. 25, 2008

(54) DISTRIBUTED DELAY-LOCKED-BASED CLOCK AND DATA RECOVERY SYSTEMS

(75) Inventors: Ravindran Mahanavelu, Terrance, CA (US); Payam Heydari, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/382,807

(22) Filed: May 11, 2006

(65) Prior Publication Data

US 2006/0198235 A1 Sep. 7, 2006

Related U.S. Application Data

(63) Continuation of application No. 10/857,630, filed on May 28, 2004, now Pat. No. 7,057,435.

(60) Provisional application No. 60/475,024, filed on May 30, 2003.

(51) Int. Cl.
*H03H 11/26* (2006.01)
(52) U.S. Cl. .................. 327/261; 327/268; 327/283; 327/290
(58) Field of Classification Search ............. 327/261, 327/262, 264, 268, 283–285, 290, 270–272, 327/276–278; 375/375, 376
See application file for complete search history.

(56) References Cited

U.S. PATENT DOCUMENTS

| | | | |
|---|---|---|---|
| 4,701,714 A | 10/1987 | Agoston | 327/277 |
| 4,984,255 A * | 1/1991 | Davis et al. | 375/354 |
| 5,130,564 A | 7/1992 | Sin | 327/264 |
| 5,164,966 A | 11/1992 | Hershberger | 375/359 |
| 5,610,954 A * | 3/1997 | Miyashita et al. | 375/375 |
| 5,629,652 A | 5/1997 | Weiss | 331/108 B |
| 5,799,048 A | 8/1998 | Farjad-Rad et al. | 375/360 |
| 5,912,596 A | 6/1999 | Ghoshal | 331/117 R |
| 5,953,386 A * | 9/1999 | Anderson | 375/376 |
| 5,987,085 A * | 11/1999 | Anderson | 375/374 |
| 6,008,680 A | 12/1999 | Kyles et al. | 327/277 |
| 6,028,903 A | 2/2000 | Drost et al. | 375/360 |

(Continued)

OTHER PUBLICATIONS

Kreienkamp et al., "A 10-Gb/s CMOS Clock and Data Recovery Circuit with an Analog Phase Interpolator", IEEE Custom Integrated Circuits Conference.

(Continued)

*Primary Examiner*—Lincoln Donovan
*Assistant Examiner*—Hai L. Nguyen
(74) *Attorney, Agent, or Firm*—Orrick, Herrington & Sutcliffe LLP

(57) ABSTRACT

A clock and data recovery system using a distributed variable delay line is provided. The clock and data recovery system can use a delay-locked loop methodology to align a local clock with an incoming data stream. The variable delay line can include a transmission line coupled with a plurality of variable capacitors responsive to a control voltage. The variable delay line can also have a ladder configuration of multiple LC subcircuits each having a variable impedance responsive to a control voltage.

18 Claims, 14 Drawing Sheets

U.S. PATENT DOCUMENTS

| | | | | |
|---|---|---|---|---|
| 6,064,236 | A * | 5/2000 | Kuwata et al. | 327/12 |
| 6,166,572 | A | 12/2000 | Yamaoka | 327/149 |
| 6,686,777 | B1 | 2/2004 | Karlquist | 327/2 |
| 6,690,243 | B1 | 2/2004 | Henrion | 331/117 R |
| 6,771,728 | B1 | 8/2004 | Abernathy | 375/371 |
| 6,816,031 | B1 | 11/2004 | Miller | 333/164 |
| 7,016,613 | B2 * | 3/2006 | Savoj | 398/155 |
| 7,027,548 | B1 * | 4/2006 | Palusa et al. | 375/375 |
| 7,057,435 | B2 * | 6/2006 | Mahanavelu et al. | 327/261 |
| 7,103,131 | B1 * | 9/2006 | Byran et al. | 375/375 |
| 2004/0036541 | A1 | 2/2004 | Fang et al. | |

OTHER PUBLICATIONS

Reinhold et al., "A Fully Integrated 40-Gb/s Clock and Data Recovery IC with 1:4 DEMUX in SiGe Technology", IEEE Journal of Solid State Circuits, vol. 36, No. 12, Dec. 2001, pp. 1937-1945.

Maitlard et al., "A 900-Mb/s CMOS Data Recovery DLL Using Half-Frequency Clock", IEEE Journal of Solid-State Circuits, vol. 37, No. 6, Jun. 2002, pp. 711-715.

Journal of Solid-State Circuits, vol. 37, No. 6, Jun. 2002, pp. 711-715.

Sajov et al., "A 10-Gb/s CMOS Clock and Data Recovery Circuit with a Half-Rate Linear Phase Detector", IEEE Journal of Solid-State Circuits, vol. 36, No. 5, May 2001, pp. 761-768.

Savoj et al., "A 10-Gb/s CMOS Clock and Data Recovery Circuit with a Half-Rate Binary Phase/Frequency Detector", IEEE Journal of Solid-State Circuits, vol. 38, No. 1, Jan. 2003, pp. 13-21.

Rogers et al., "A 10-Gb/s CDR/DEMUX with LC Delay Line VCO in 0.18μm CMOS", IEEE Journal of Solid-State Circuits, vol. 37, No. 12, Dec. 2002, pp. 1781-1789.

Cao et al., "OC-192 Transmitter and Receiver in Standard o.18-μm CMOS", IEEE Journal of Solid-State Circuits, vol. 37, No. 12, Dec. 2002, pp. 1768-1780.

Greshishchev et al., "A Fully Integrated SiGe Receiver IC for 10-gb/s Data Rate", IEEE Journal of Solid-State Circuits, vol. 35, No. 12, Dec. 2000, pp. 1949-1957.

Lee et al., "A 40 Gb/s Clock and Data Recovery Circuit in 0.18μm CMOS Technology", 2003 IEEE International Solid-State Circuits Conference (Feb. 11, 2003), Session 13, Paper 13.7.

Wurzer et al., "A 40-Gb/s Integrated Clock and Dtat Recovery Circuit in a 50-GHz Fr Silicon Bipolar Technology", IEEE Journal of Solid-State Circuits, vol. 34, No. 9, Sep. 1999, pp. 1320-1324.

* cited by examiner

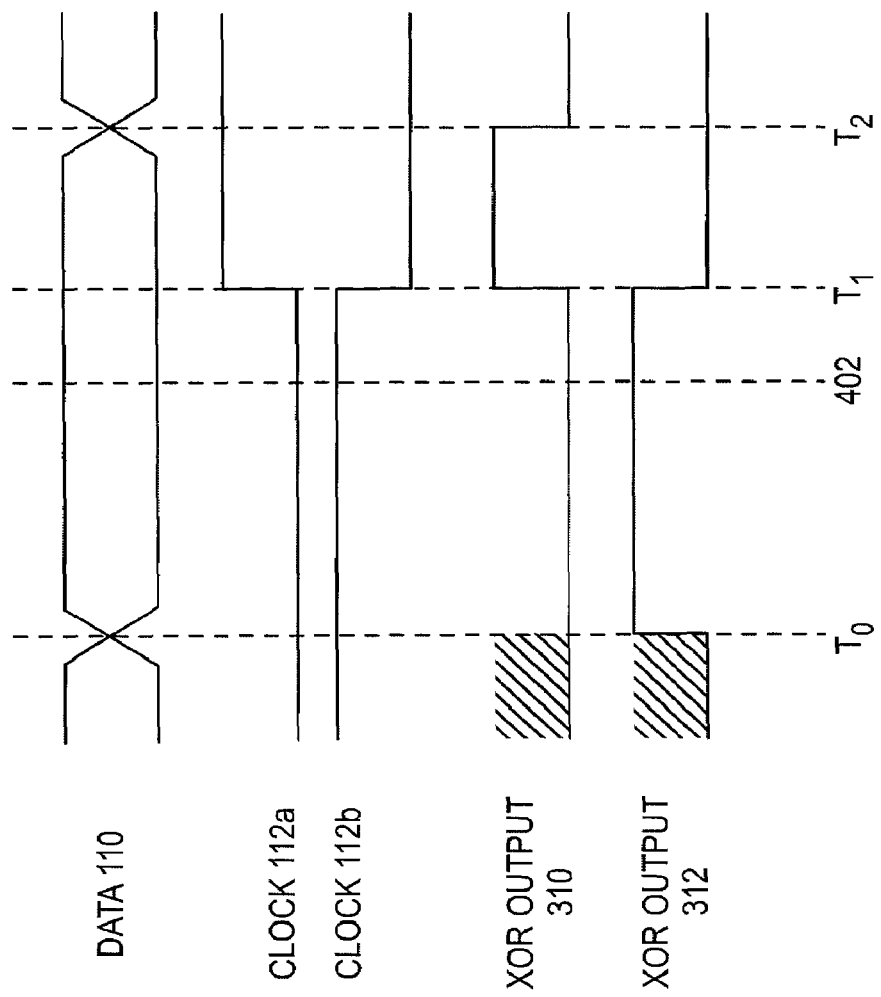

DISTRIBUTED DELAY-LOCKED-BASED CLOCK AND DATA RECOVERY SYSTEMS

CROSS-REFERENCE TO RELATED APPLICATIONS

This application is a continuation of U.S. patent application Ser. No. 10/857,630, filed May 28, 2004, now U.S. Pat. No. 7,057,435 B2, issued on Jun. 6, 2006, and which claims the benefit of U.S. Provisional Application No. 60/475,024, filed May 30, 2003, all of which are incorporated herein by reference.

FIELD OF THE INVENTION

The present invention relates generally to clock and data recovery systems, and more particularly to distributed clock and data recovery systems using a variable delay line architecture.

BACKGROUND OF THE INVENTION

One of the primary enabling blocks in the silicon interface for communication networks is the clock and data recovery ("CDR") circuit. CDR circuits compare an incoming non-return to zero (NRZ) data stream to an on-board or local clock signal using a phase detector and, based on the phase difference, adjust the clock signal until it is in-phase or aligned with the data stream. The in-phase clock signal can then be used to interpret the incoming NRZ data stream. Typically, CDR circuits employ a phase-locked loop architecture where a voltage signal proportional to the phase or frequency difference is used to adjust a voltage-controlled oscillator (VCO), which provides the local clock signal. However, the use of a VCO can introduce an undesirable amount of timing jitter.

Conventional CDR circuits also commonly use full-rate architectures, which do not allow for easy scaling to higher speeds and frequencies. This is because full-rate architectures require more system components to work at higher frequencies and this limits the maximum use of the technology capabilities. Certain half-rate structures also use a large number of current-mode logic ("CML") logic components to design the phase detector building block, which is also difficult to replicate at higher bit rates because the current drive and voltage swing capabilities of these components at high frequencies are severely limited by technology. The necessity to combine phase detection and frequency detection to achieve a fast acquisition time and better accuracy further complicates the design of phase detectors at higher frequencies.

Furthermore, CDR circuits for high data rates, such as 40 Gigabits per second (Gb/s), have been demonstrated using Bipolar Complimentary-Metal-Oxide Semiconductor ("BiCMOS") and compound semiconductor processes. However, these processes are expensive, power hungry and not capable of integration with the remaining communication architecture.

Accordingly, improved clock and data recovery circuits are desirable.

SUMMARY

The systems described in this section are done so by way of exemplary embodiments and are not intended to limit the subject matter of the claims in any way.

In one exemplary embodiment, a circuit includes a first section having a plurality of transistors configured to compare the phase of a data stream with the phase of a local clock and output a control voltage corresponding to the difference in phase between the data stream and clock, where each of the transistors is the N-type. The circuit also includes a variable delay line having a plurality of variable impedance LC sub-circuits responsive to the control voltage, where the variable delay line is configured to delay the local clock by an amount corresponding to the control voltage. The circuit further includes a feedback loop configured to provide the delayed local clock to the first section.

In another exemplary embodiment, a circuit includes a track circuit having a differential pair of transistors and a first current tail transistor, where the gates of each transistor in the differential pair are coupled with a first input. The circuit also includes a latch circuit coupled with the track circuit and comprising a cross-coupled pair of transistors and a second current tail transistor, where the sources of each transistor in the cross-coupled pair are coupled with a latch output and the sources of the differential transistors in track circuit. The circuit further includes a track control circuit coupled with the track circuit and having a second input, where the track control circuit is configured to enable the track circuit when the signal provided to the second input is at a first predetermined logic state such that the latch output tracks the first input, and further where the tack control circuit is configured to disable the track circuit when the signal provided to the second input is at a second predetermined logic state.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. It is also intended that the invention is not limited to require the details of the example embodiments.

BRIEF DESCRIPTION OF THE FIGURES

The details of the invention, both as to its structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

FIGS. 4A-B are timing diagrams depicting the various input and output signals of another exemplary embodiment of a phase detector.

DETAILED DESCRIPTION

Distributed clock and data recovery (CDR) systems using a delay-locked architecture with distributed variable delay lines are provided herein. The CDR systems are scalable across a wide range of bit rates and frequencies making them suitable for numerous applications including, but not limited to, broadband high-speed optical communication systems. The CDR systems can be implemented in inexpensive digital semiconductor processes, such as complementary-metal-oxide semiconductor (CMOS) processes and the like.

Figure 1:
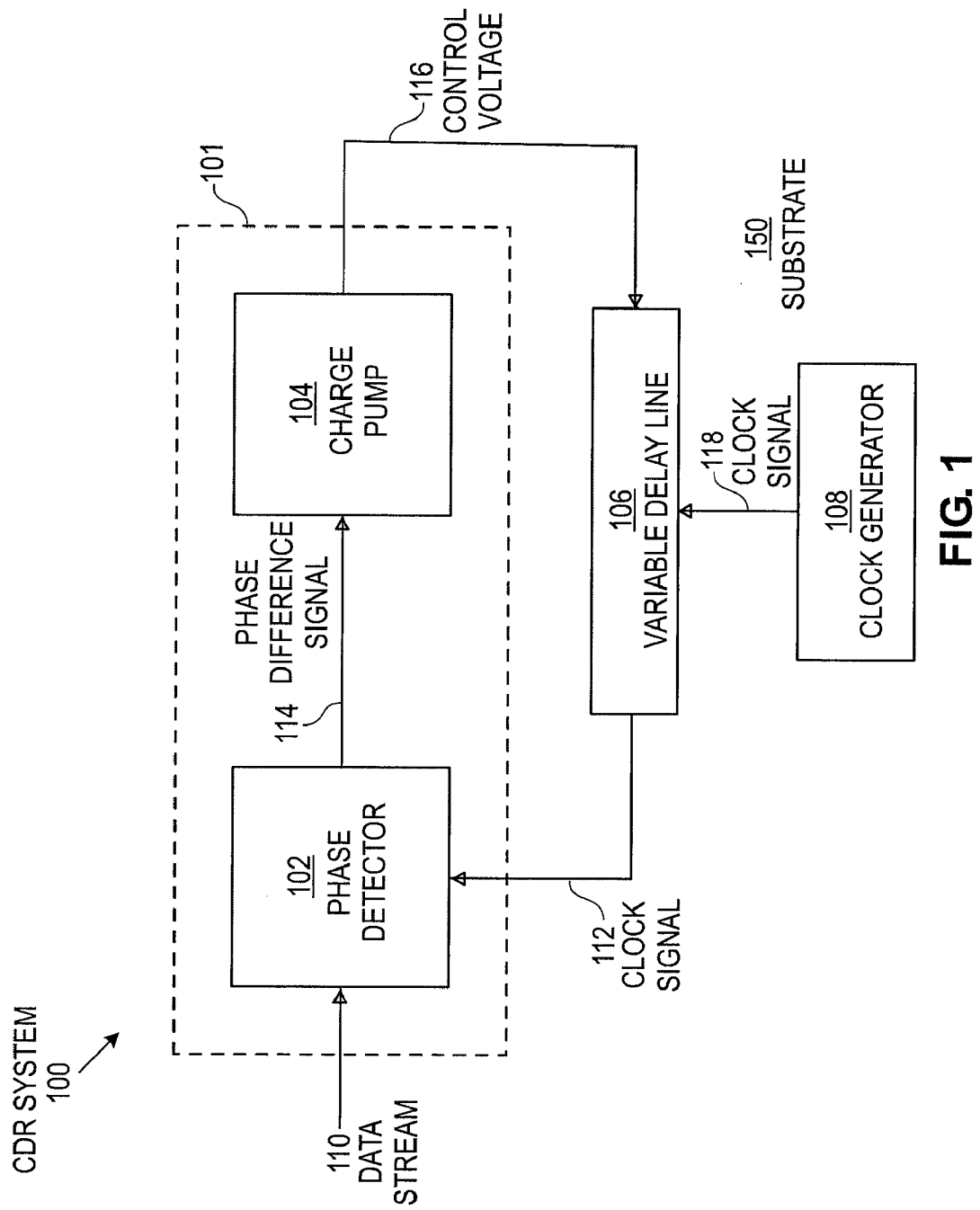
FIG. 1 is a block diagram of one exemplary embodiment of a clock and data recovery system.

FIG. 1 depicts one exemplary embodiment of CDR system 100. CDR system 100 uses variable delay line 106 to vary the delay in a clock signal to "lock" the incoming data through feedback control. In this embodiment, CDR system 100 includes a first section 101 coupled with a variable delay line 106. First section 101 includes a phase detector 102 coupled with a charge pump 104. The phase detector 102 is configured to compare incoming data stream 110 with clock signal 112 and output phase difference signal 114 corresponding in magnitude to the phase difference between data stream 110 and clock signal 112. Although phase detector 102 is amenable to numerous configurations in accordance with the needs of the application, in a preferred embodiment, phase detector 102 is a linearized half-rate "bang-bang" phase-detector and will be discussed in more detail with respect to FIGS. 2-3 below. Charge pump 104 averages phase difference signal 114 and outputs control voltage 116, which is routed to variable delay line 106.

Preferably, variable delay line 106 is a voltage-controlled delay line configured to delay a signal propagating along the line by an amount corresponding to the magnitude of control voltage 116. In this embodiment, variable delay line 106 is coupled with clock generator 108, which generates a high precision internal clock signal 118 oscillating at a frequency similar to that of the expected incoming data rate. Internal clock signal 118 is routed on variable delay line 106 where it is delayed and, consequently, phase adjusted, by an amount corresponding to the magnitude of control voltage 116. This phase adjusted clock signal is output as clock signal 112, which is fed back into phase detector 102.

In this manner, CDR system 100 utilizes a delay-locked loop methodology to continuously adjust the phase of clock signal 112 to maintain a minimal phase difference with the incoming data stream 110. Unlike phase locked loop ("PLL")-based CDR circuits, CDR system 100 does not require additional passive components for stability. CDR system 100 also produces less timing jitter due to the robust noise performance of variable delay line 106 as compared with a VCO.

Figure 2:
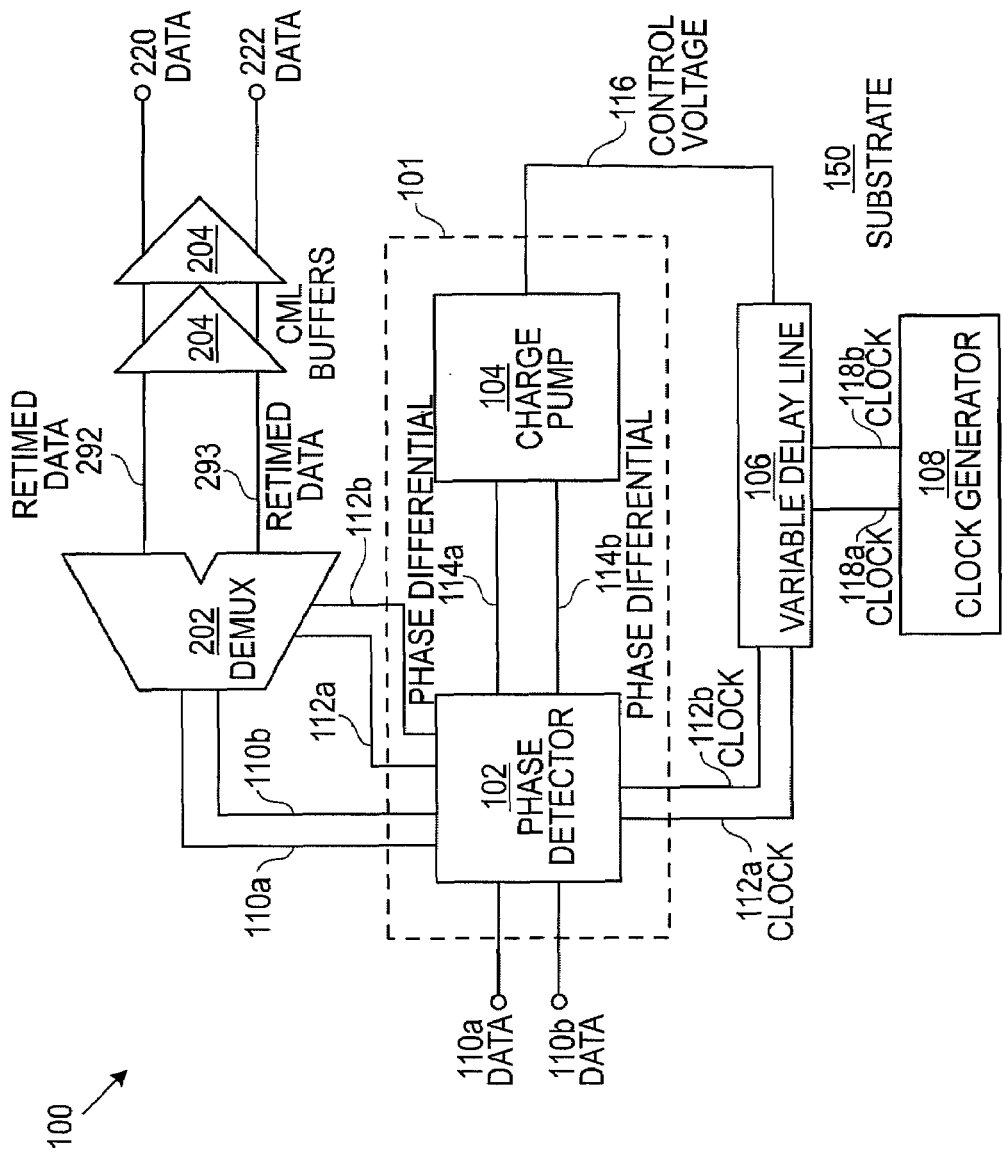
FIG. 2 is a block diagram of another exemplary embodiment of a clock and data recovery system.

FIG. 2 depicts another embodiment of CDR system 100, where phase detector 102 is a half-rate linearized bang-bang phase detector and the incoming data stream is composed of differential signals 110a,b. Generally, bang-bang phase detectors correct the clock signal phase on every edge based on whether the clock leads or lags the data. The incorporation of a half-rate architecture can allow one to take advantage of the frequency capabilities of sub-micron digital technologies, such as CMOS and the like, by relaxing the speed requirements of the various components of system 100. Because a half-rate configuration is used, two non-overlapping clock signals 112a, 112b are provided with clock signal 112b preferably being substantially 180 degrees out of phase with clock signal 112a.

One of skill in the art will readily recognize that the phase difference between clock signals 112a and 112b can be chosen based on the needs of the application. Furthermore, one of skill in the art will recognize that the 180 degree phase difference of 180 degrees need not be absolute or exact, and a phase difference of substantially 180 degrees will suffice such that system 100 can operate within the constraints of the desired application.

Figure 3:
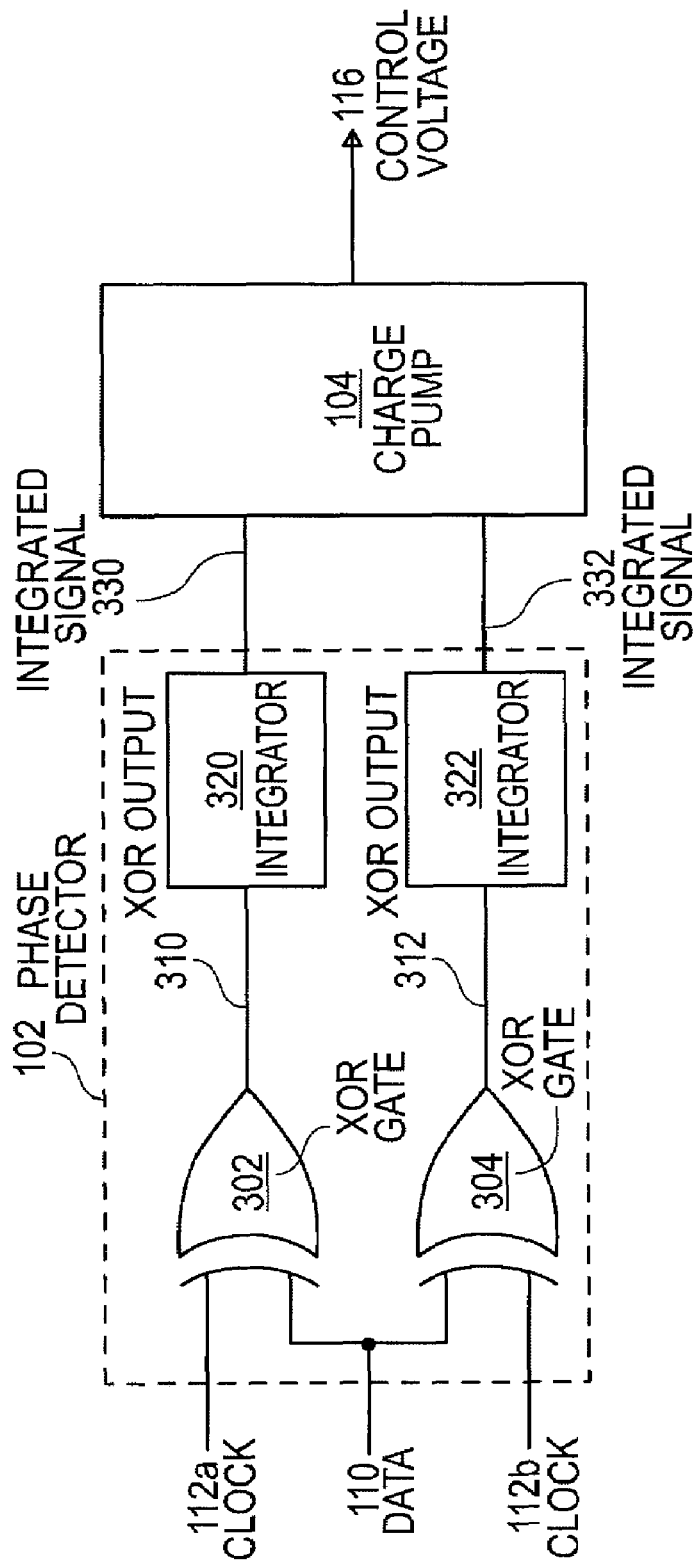
FIG. 3 a schematic view of an exemplary embodiment of a phase detector.

FIG. 3 depicts one exemplary embodiment of half-rate phase detector 102 coupled with charge pump 104. Here, phase detector 102 includes two exclusive-OR (XOR) gates 302 and 304 clocked with clock signals 112a,b. One of the inputs to each gate 302 and 304 is incoming data stream 110. Clock signals 112a and 112b provide the other input to each XOR gate 302 and 304, respectively.

Figure 4B:
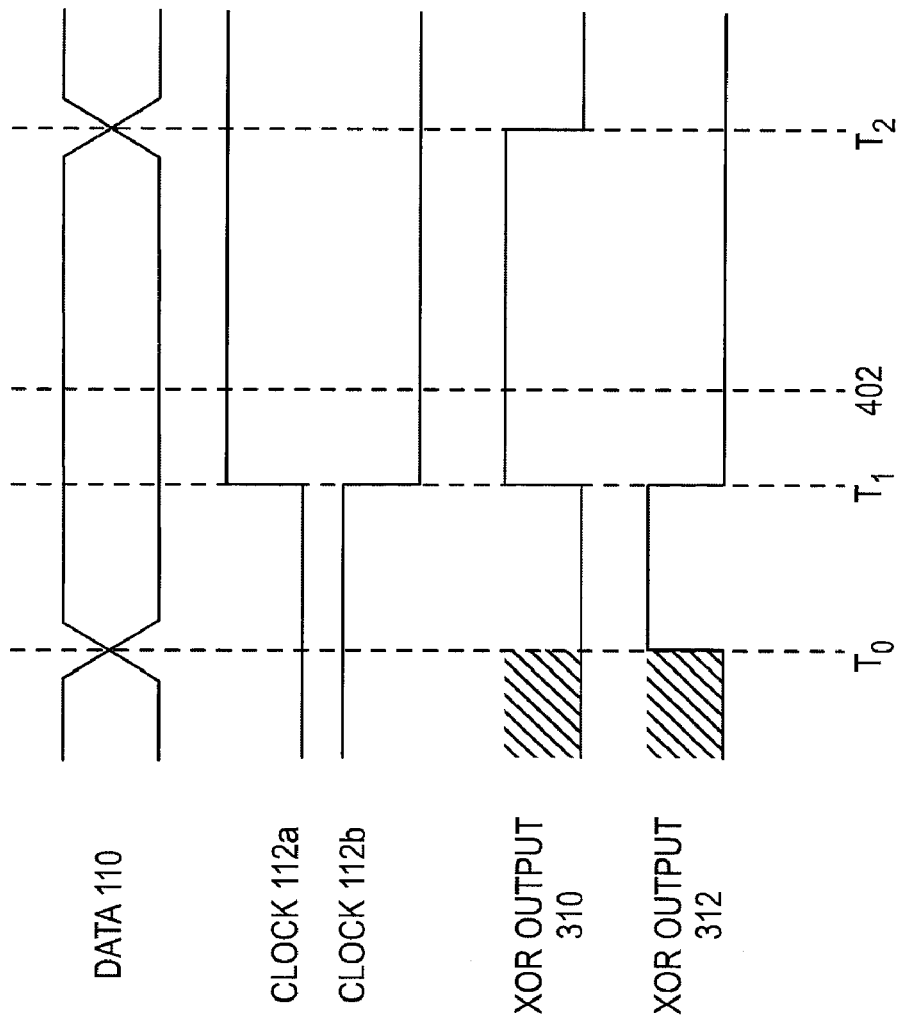

FIGS. 4A-B depict timing diagrams of differential data signals 110a,b and clock signals 112a,b input to each XOR gate 302 and 304, as well as the XOR gate output signals 310 and 312. FIG. 4A depicts the case where clock signals 112a,b lead the random data transition. Prior to $T_0$, clock signal 112a is a logic low and clock signal 112b is a logic high, while the state of the XOR outputs 310 and 312 is ignored. At $T_0$, data stream 110 transitions, to a low value for instance, and causes XOR output 310 to become low and XOR output 312 to become high. At $T_1$, clock signals 112a,b transition ahead of the data, causing XOR output 310 to become high and XOR output 312 to become low. At $T_2$, signal 110 transitions again causing XOR outputs 310 and 312 to be low. Outputs 310 and 312 will be equal only when the half-rate clock signals 112a,b are at center 402 of incoming data stream 110. FIG. 4B depicts a similar case where clock signals 112a,b lag the random data transition.

Figure 5B:
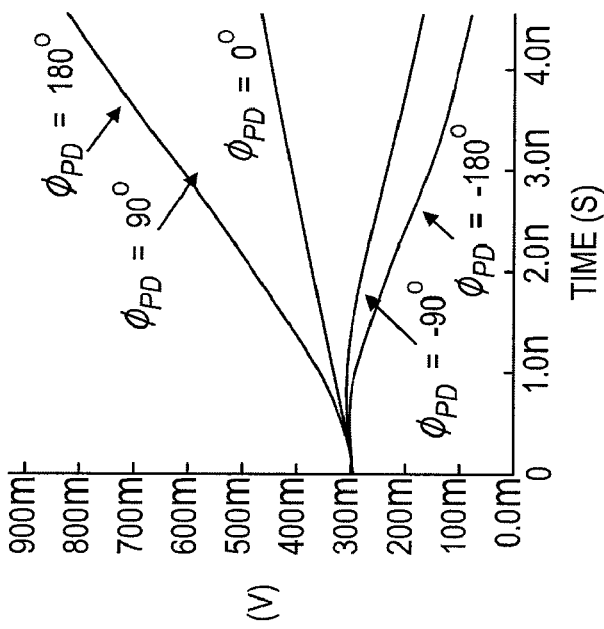
FIG. 5B is a graph of the output signals of an exemplary embodiment of a charge pump for the signals depicted in FIG. 5A.
Figure 5A:
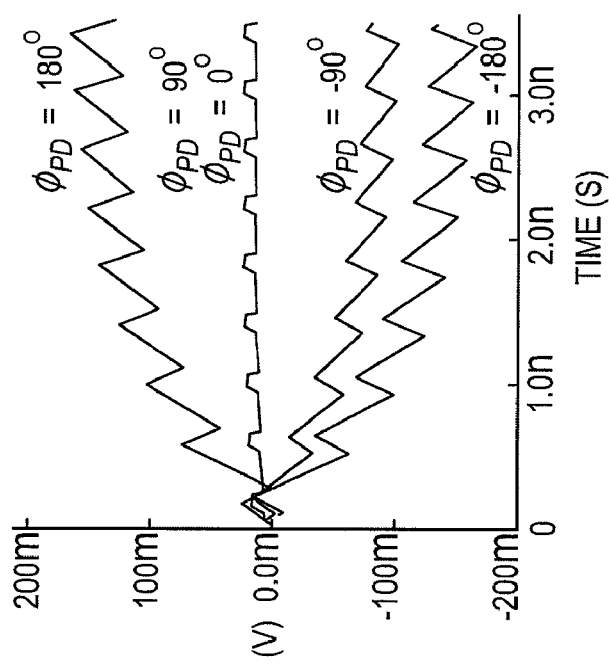
FIG. 5A is a graph of the output signals of another exemplary embodiment of a phase detector for various phase differences between the clock and data.

Referring back to FIG. 3, each XOR gate 302 and 304 preferably incorporates a low pass filter to filter the XOR outputs 310 and 312 and provide phase detector 102 with the preferred linearity. This linearity is desirable to reduce any jitter associated with the bang-bang phase detector architecture. XOR output signals 310 and 312 are passed to integrators 320 and 322, respectively. Integrators 320 and 322 integrate XOR output signals 310 and 312 and also remove any DC component present in signals 310 and 312. The resulting integrated signals 330 and 332 are effectively differential signals the polarity of which corresponds to whether clock signals 112a,b lead or lag incoming data stream 110. FIG. 5A depicts examples of the differential phase detector output signals 330 and 332 for various differences in phase between clock signals 112a,b and data stream 110.

Figure 6:
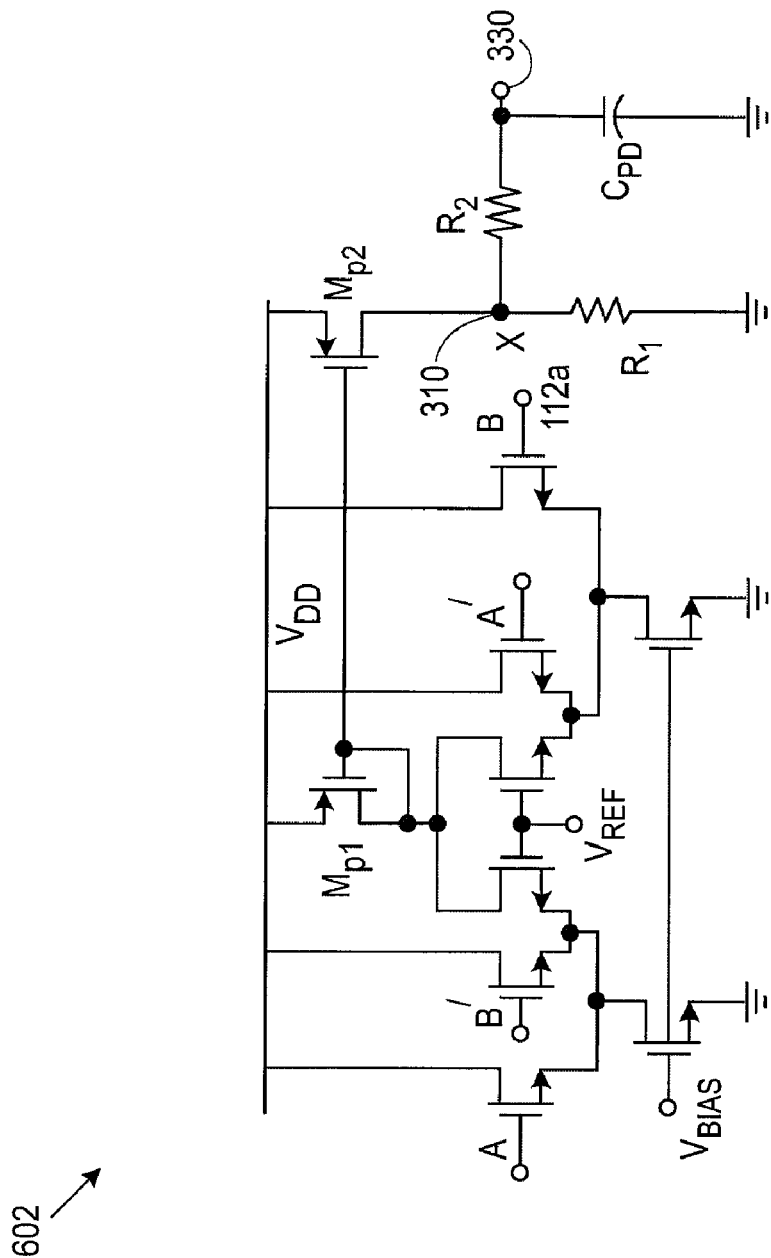
FIG. 6 is a schematic view of one exemplary embodiment of an exclusive-OR circuit.

FIG. 6 depicts one exemplary embodiment of linearized XOR gate circuit 602 suitable for use in XOR gates 302 and 304. Here, XOR gate circuit 602 incorporates both the exclusive-OR logic operation and the filtering action for one differential signal path of phase detector 102. PMOS transistor $M_{p2}$ preferably operates in the triode region, thereby acting as a voltage-controlled resistor whose value is controlled by the input signals A, A', B, and B'. The input signals A, A', B, and B' are appropriately connected with data signals 110a,b and clock signals 112a,b. The voltage at node X is thus indicative of the XOR operation and can serves as either output signal 302 or 304. Here, input node B is coupled with clock signal 112a, output node X provides output signal 310. $M_{p2}$ along with resistors $R_1$ and $R_2$ and the capacitor $C_{PD}$ realize the averaging operation and output node Z provides output signal 330. $V_{bias}$ and $V_{ref}$ are connected with bias and reference sources as needed by the application.

Figure 7:
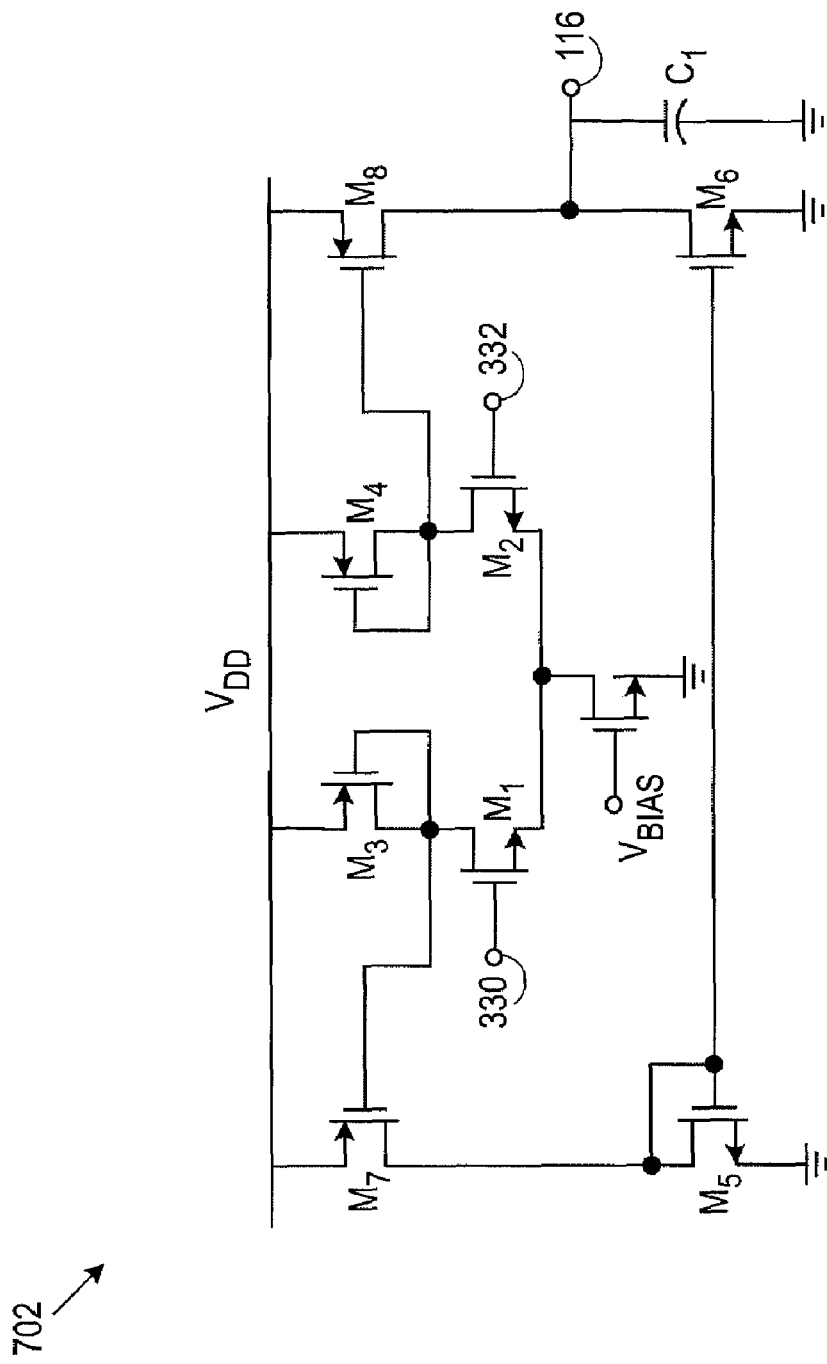
FIG. 7 is a schematic view of one exemplary embodiment of a charge pump.

Differential output signals 330 and 332 are output from phase detector 102 to charge pump 104, which preferably averages the two signals 330 and 332 to remove any high frequency components and outputs a single ended DC control voltage 116. FIG. 5B depicts multiple examples of charge pump output signal 116 for various differences in phase between clock signals 112a,b and data stream 110. FIG. 7 depicts one exemplary embodiment of charge pump circuit 702, which is suitable for use as charge pump 104. Differential output signals 330 and 332 are fed to NMOS transistors $M_1$ and $M_2$, respectively, which form a differential pair. This pair controls the direction of current flow into or out of filter capacitor $C_1$. Once CDR system 100 is substantially locked, the phase detector output signals 330 and 332 are equal, the differential input becomes negligible and the voltage is maintained across the filter capacitor $C_1$.

Figure 8:
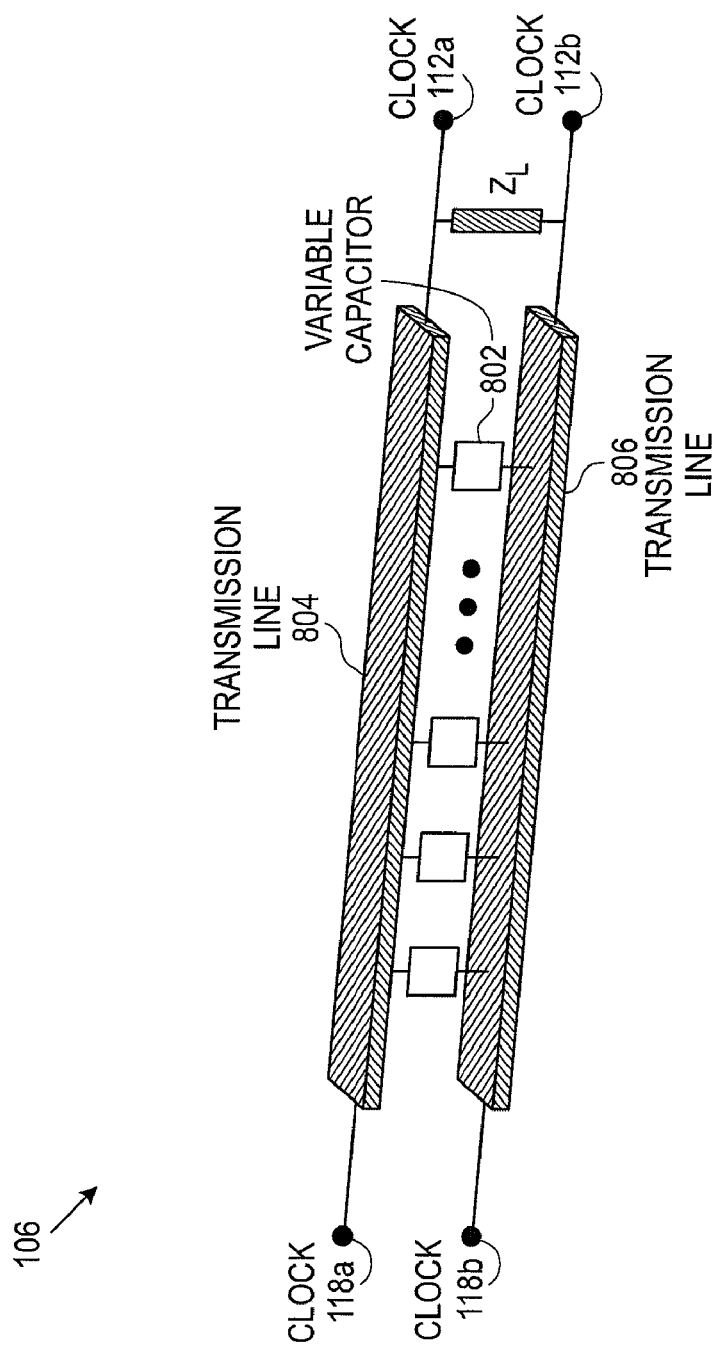
FIG. 8 is a block diagram of one exemplary embodiment of a variable delay line.

FIG. 8 depicts an exemplary embodiment of variable delay line 106, having multiple variable capacitors 802 and two transmission lines 804 and 806 for differential clock signals 112a and 112b, respectively. Variable delay line 106 can also be configured for use with a single-ended clock signal as desired. Variable delay line 106 is preferably distributed, i.e., integrated with the other components of CDR system 100 on common semiconductor substrate 150. As stated above, CDR circuit 100 can be fabricated in a CMOS process, facilitating direct integration of CDR circuit 100 into a communication system.

As one of skill in the art will recognize, any two uniform parallel conductors, i.e., the signal and the return paths, that are used to transmit electromagnetic energy can be considered transmission lines if the propagation delay of the signals traveling through these wires is comparable to the time of flight. The return path can be a ground plane, a ground conductor, or a mesh of ground lines on many layers. Solutions to Maxwell's equations for the electric and magnetic fields around conductors are current and voltage waves. The wave solutions are completely determined in terms of the characteristic impedance, $Z_o$, and the propagation constant, $\gamma$. In a matched terminated transmission line where $Z_o$ substantially equals the load impedance, $Z_L$, all the incident waves are absorbed in the load and no considerable reflection from the load will take place. The line thus introduces a pure propagation delay of $T_D = h\sqrt{lc}$ on the traveling waves, where h is the line length, and l and c are the per-unit length inductance and capacitance of the line, respectively.

Variable delay line 106 is designed based in part on the above property. Variable capacitors 802 are preferably implemented as varactors. With a large number of varactors 802 along the line 106, each transmission line 804 and 806 along with varactors 802 can be modeled as a new variable transmission line whose characteristic impedance and propagation constant are as follows:

$$Z_{0,new} = \sqrt{l/(c+nC_v/h)}; \gamma_{new} = \sqrt{l(c+nC_v/h)}$$

where n is the number of varactors along the line, and $C_v$ is the capacitance of each varactor 802. Each transmission line 804 and 806 is preferably terminated with a matched load $Z_L$ having an impedance substantially equal to that of $Z_{o,new}$.

Figure 9:
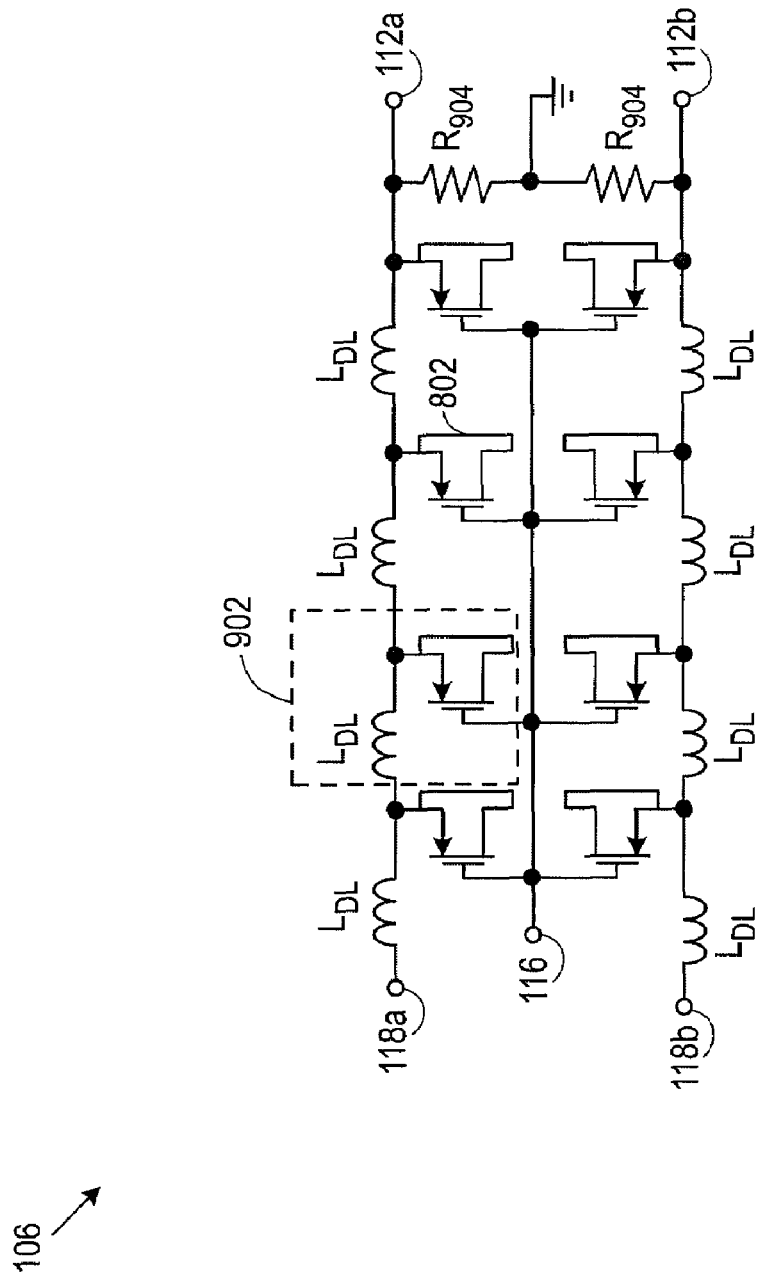
FIG. 9 is a schematic view of another exemplary embodiment of a variable delay line.

In one exemplary embodiment, transmission lines 804 and 806 are each artificial transmission lines using a matched terminated ladder of LC subcircuits 902, as depicted in FIG. 9. Each LC subcircuit 902 has a variable impedance, achieved through use of a variable capacitor, variable inductor or a combination thereof. The use of LC subcircuits 902 allows variable delay line 106 to operate at higher frequencies, e.g., frequencies higher than 10 Ghz, than other delay lines constructed with digital components such as shift-registers, flip-flops and inverters.

In this embodiment, each LC subcircuit is a combination of a varactor 802 and an inductor $L_{DL}$. Transmission lines 804 and 806 are realized using a series concatenation of on-chip inductors $L_{DL}$, which can be spiral, annular, polygonal and the like. Each varactor 802 is a PMOS transistor with the drain and source coupled together. Matching resistors 904 are also included to maximize power transfer. In the embodiment depicted in FIG. 9, each transmission line 804 and 806 includes four LC ladder subcircuits 902 terminated by resistor 904, which is preferably matched to the impedance $R_{902} = \sqrt{L_{DL}/C_v}$, in order to maximize the power transfer. The phase of clock signals 112a and 112b at the end of variable delay line 106 can be varied with control voltage 116 coupled with the gates of PMOS transistors 802.

Figure 10:
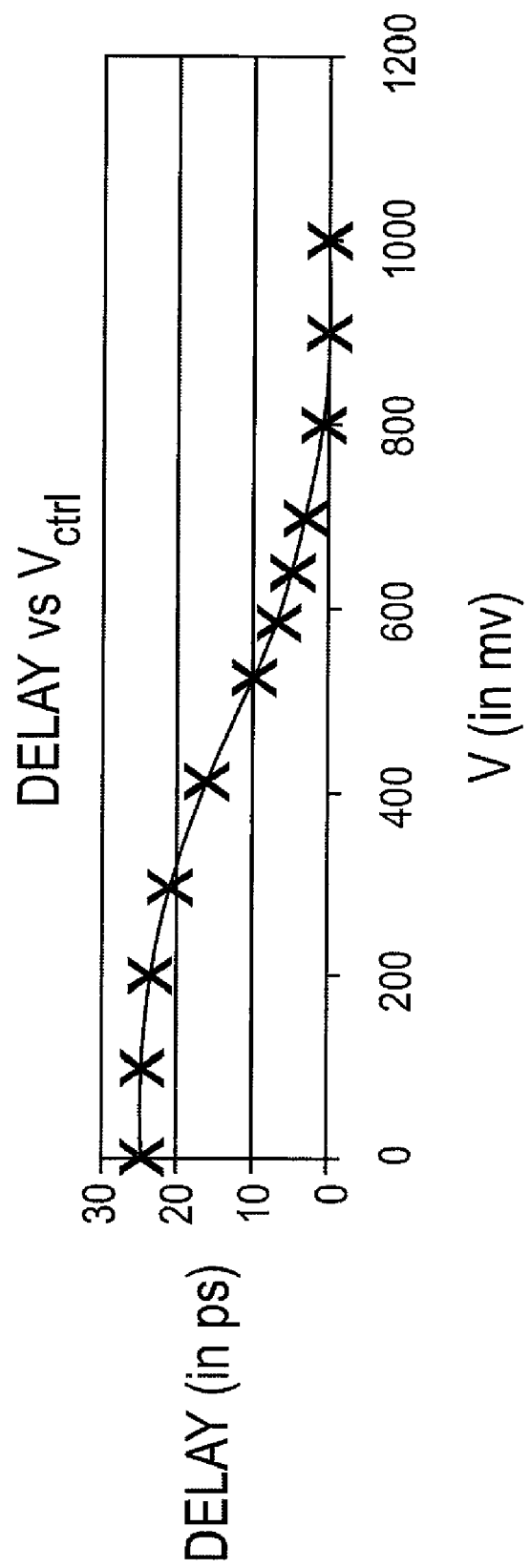
FIG. 10 is a graph of the delay performance over a range of control voltages for another exemplary embodiment of a variable delay line.

Different criteria should be accounted for while designing variable delay line 106, such as signal integrity, and the linearity of delay variation over a range of values of control voltage 116. Attention to these criteria can produce a robust design that has a minimum sensitivity to process and signal variations. Also, the delay variation should be a linear function of control voltage 116. For instance, FIG. 10 depicts a graph of the performance of one exemplary embodiment of variable delay line 106. Here, it can be seen that delay line 106 exhibits a generally linear behavior for voltages varying from 300 millivolts (mV) to 700 mV. This embodiment of delay line 106 is used in an exemplary application where half rate clock signals 112a,b operate at 10 Ghz. Delay line 106 preferably provides a variable delay of at least 20 picoseconds (ps), which is 20% of the 10 Ghz clock period. In FIG. 10, it can be seen that this embodiment can provide a delay up to 24 ps with control voltage 116 varying between 0 volts (V) and 0.9 V. CDR system 100 can be designed to provide more or less delay variability, with the specific amount being dependent on the needs of the application.

During operation of CDR system 100, the capacitances of varactors 802 are varied by control voltage 116, causing the characteristic impedance of transmission lines 804 and 806 to vary. Preferably, termination resistors 902 are designed to closely match the characteristic impedance termination over the voltage range of interest. Also, it should be noted that it is desirable to limit the number and value of inductors $L_{DL}$ used in delay line 106. In the exemplary embodiment depicted in FIG. 9, each inductor $L_{DL}$ has an inductance of 1 nano-Henry (nH).

Figure 11:
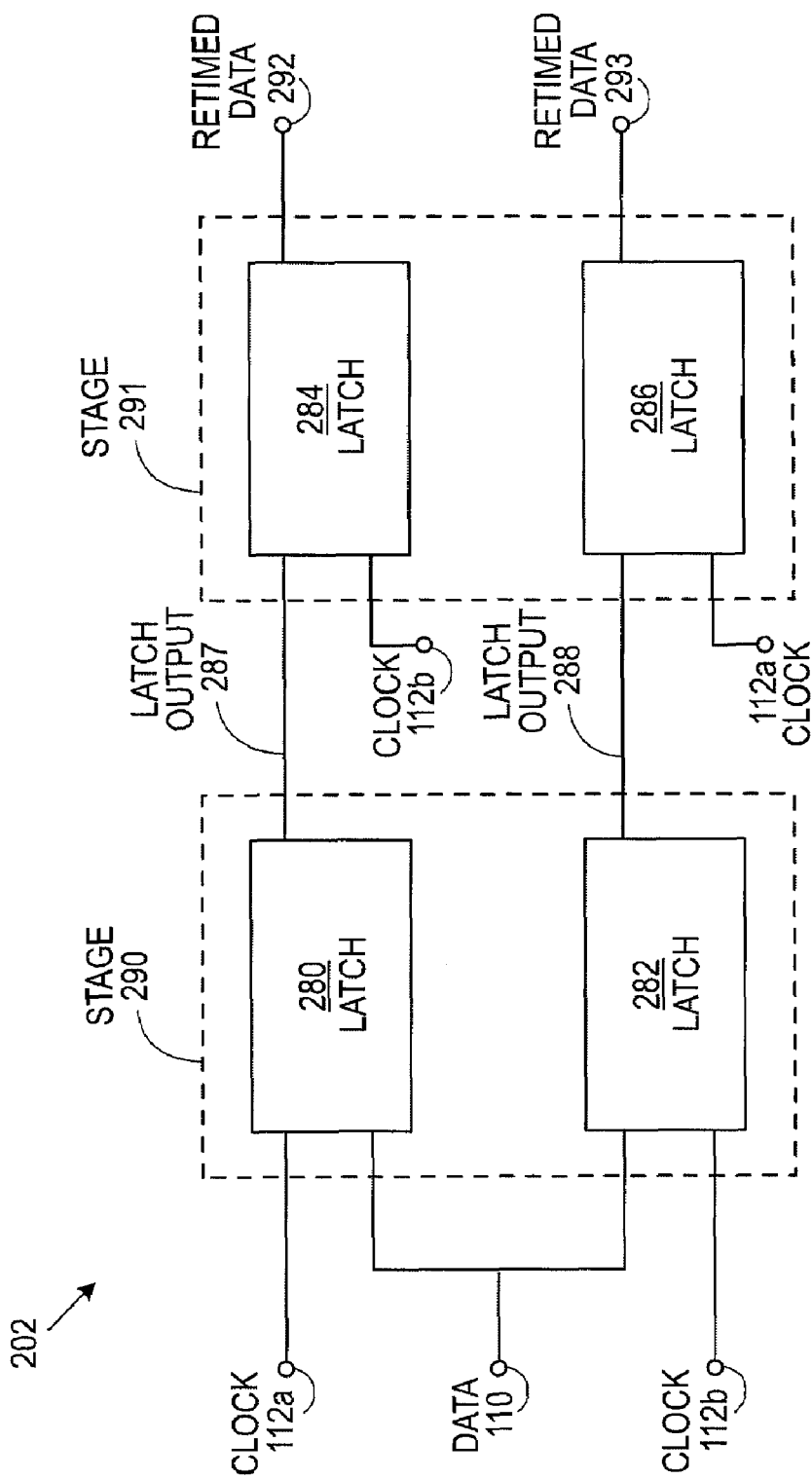
FIG. 11 is a block diagram of one exemplary embodiment of a demultiplexer.

Referring back to the embodiment depicted in FIG. 2, after clock signals 112a,b are aligned to data stream 110, it can be used to retime and de-multiplex data stream 110 into two data streams 220 and 222 using demultiplexer 202. This can be done to facilitate further processing of the data under less stringent frequency requirements. FIG. 11 depicts one exemplary embodiment of demultiplexer 202, using two stages 290 and 291 of cascaded latches 280-286, although it should be noted that any number of stages can be used in accordance with the needs of the application.

In this embodiment, data stream 110 is incoming at a rate of 20 Gb/s and aligned clock signals 112a,b are operating at 10 Ghz and 180 degrees out of phase. Data stream 110 is input into first stage 290, specifically latches 280 and 282. Clock signal 112a is input to latch 280 while clock signal 112b is input to latch 282. Latches 280 and 282 output latched signals 287 and 288, respectively, to second stage 291. Latched signal 287 and clock signal 112b are input to latch 284, while latched signal 288 and clock signal 112a are input to latch 286.

Latches 284 and 286 then output the retimed data stream 292 and 293 to tapered current mode logic (CML) buffers 204. Since CDR system 100 can be used to drive other circuit blocks, it preferably exhibits considerable current drive capability. In this embodiment, tapered CML buffers 204 are included to drive the other logic. Both the aligned clock signals 112a,b and the aligned data stream 110 are passed through CML buffers 204 to preserve alignment. CML buffers 204 preferably increase the clock voltage swing while the DC voltage is decreased. Any number of CML buffers 204 can be used in accordance with the needs of the application.

Figure 12:
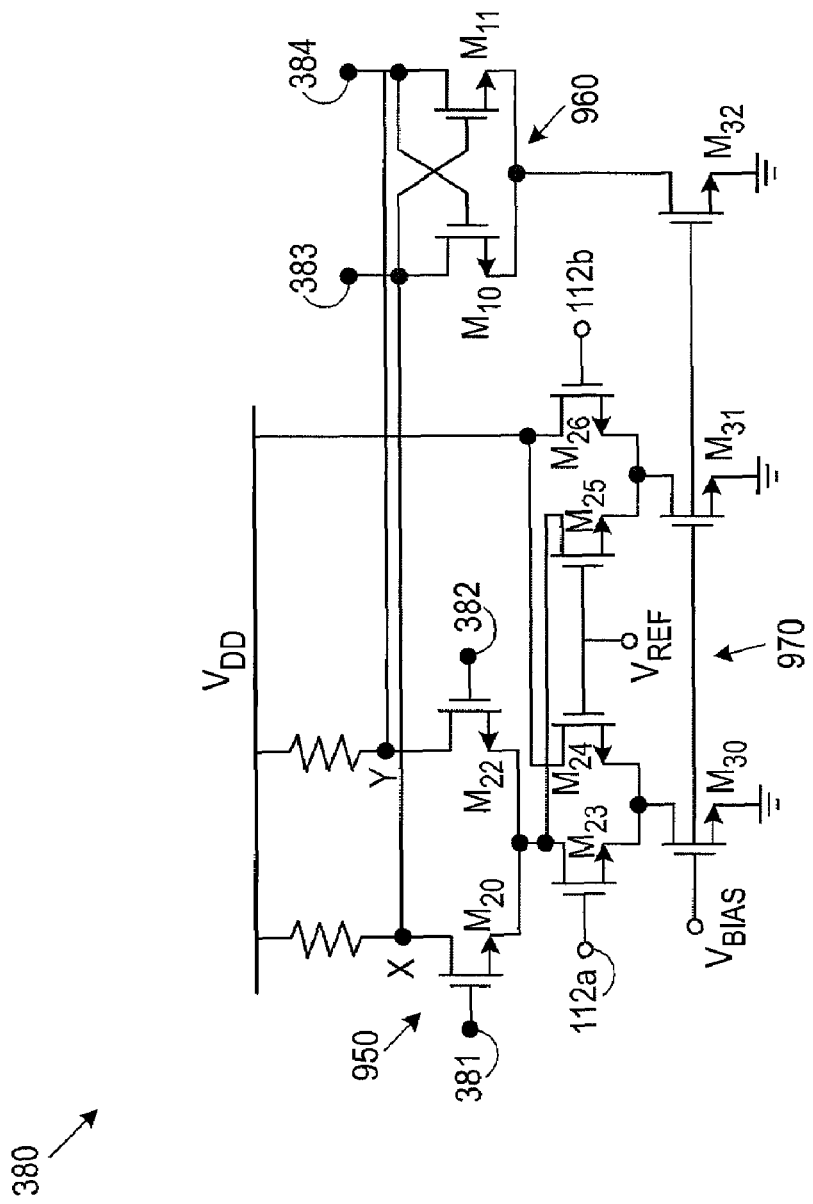
FIGS. 12-13 are schematic views of exemplary embodiments of a latch.

FIG. 12 depicts an exemplary embodiment of CML latch circuit 380, suitable for use in latches 280-286. Here, latch circuit 380 includes differential inputs 381 and 382 for implementation with an application using a differential data stream 110a,b and, accordingly, latch circuit 380 outputs the differential latched signal on differential outputs 383 and 384. Latch circuit 380 can be fabricated in numerous semiconductor processes and with numerous transistor types and constructions. In this embodiment, latch circuit 380 includes a differential pair of NMOS transistors $M_{20}$ and $M_{22}$ and a cross coupled pair of NMOS transistors $M_{10}$ and $M_{11}$. CML latch circuit 380 can operate with relatively small voltage swings, preferably on the order of twice the NMOS threshold voltage.

Latch circuit 380 generally operates in two phases, a latching phase and a tracking phase depending on clock signals 112a and 112b. Differential pair $M_{20}$ and $M_{22}$ operate as track circuit 950 and cross-coupled pair $M_{10}$ and $M_{11}$ operate as latch circuit 960. Latch circuit 380 is in tracking phase when differential clock signals 112a,b are "high," enabling track circuit 950 and allowing outputs 383 and 384 to track inputs 381 and 382. In the latching phase, differential clock signals 112a,b are "low," track circuit 950 is disabled and latch circuit 960 is enabled storing the current logic state at outputs 383 and 384. Track control circuit 970 includes transistors $M_{23}$, $M_{24}$, $M_{25}$ and $M_{26}$ and controls the enabling of track circuit 950.

In conventional latches, the primary limitation is that a single tail current transistor is used for both track and latch circuits. Consequently, the bias operations of track and latch circuits are tightly related. This severely limits the allowable transistor sizes for a reliable latch operation. At ultra high-speed data-rates, the parasitic capacitances of the tracking differential pair of transistors degrade the required minimum small-signal gain for a proper tracking operation. Therefore, the tail current must be sufficiently high to achieve a wider range of linearity and a larger transconductance (gm). However, a larger transconductance means larger device sizes, and therefore, larger parasitic capacitances. Parasitic capacitances of the tracking differential pair directly contribute to the latch delay.

In this embodiment, track circuit 950 and latch circuit 960 are separately optimized for a correct latch operation at higher speed, e.g., speeds of 10 Gb/s and higher. Latch circuit 380 includes multiple current tail transistors $M_{30}$, $M_{31}$ and $M_{32}$. The cross coupled pair of transistors $M_{10}$ and $M_{11}$ preferably have a high gain to reduce the settle time of latch 380, which occurs through positive feedback. This can be achieved by up-sizing each transistor in the cross-coupled pair $M_{10}$ and $M_{11}$.

Generally, latch circuit 960 continuously draws current from the X and Y nodes so there is no need to charge up the capacitances of transistors $M_{10}$ and $M_{11}$ during the latching phase allowing latch circuit 380 to achieve higher clock rates. As a result, CML does not suffer from current spiking at the drain of clock transistors $M_{23}$ and $M_{26}$. During the tracking interval, transistor $M_{25}$ is switched on drawing a portion of the tail current and reducing the current spikes. Also, latch circuit 960 is always enabled and no current spike occurs during the transition from tracking to latching mode.

The enabling of cross-coupled pair $M_{10}$ and $M_{11}$ during the tracking phase directly contributes to smaller rise and fall times for the output voltages at nodes X and Y. The reason is that cross-coupled pair $M_{10}$ and $M_{11}$ exhibits a negative resistance that lowers the equivalent resistance at each node X and Y for a fixed output voltage swing, thereby decreasing rise and fall times of the output voltages.

Figure 13:
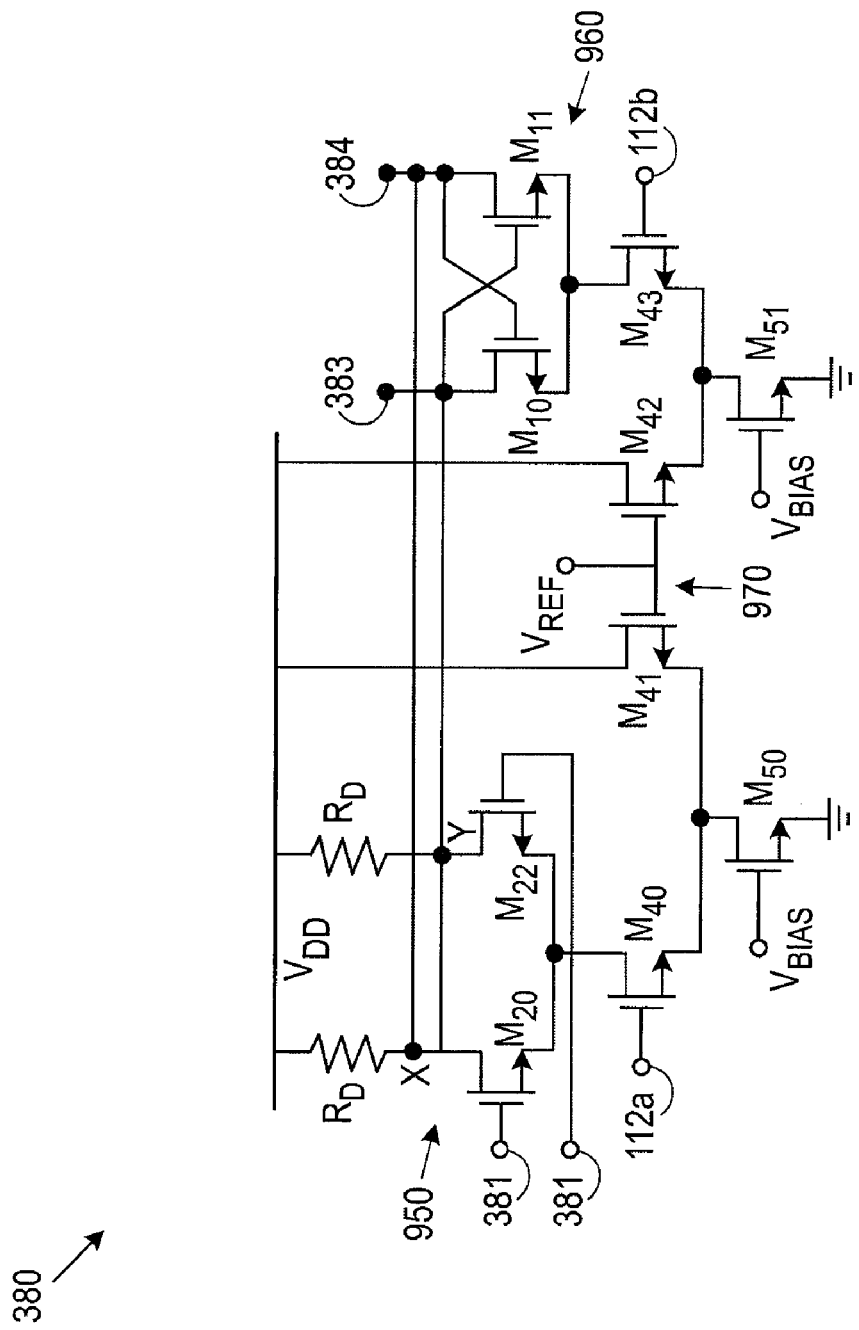

FIG. 13 depicts another embodiment of latch circuit 380 suitable for use in latches 280-286. Like the embodiment discussed with regard to FIG. 12, this embodiment has separately optimized track and latch circuits 950 and 960 for high-speed operation. Track control circuit includes transistors $M_{40}$, $M_{41}$, $M_{42}$ and $M_{43}$. This embodiment requires charging of the cross-coupled pair $M_{10}$ and $M_{11}$ during transition from the tracking phase to the latching phase and current tail $M_{51}$ recharges the capacitances of the cross-coupled pair, $M_{10}$ and $M_{11}$, as the pair starts drawing current from nodes X and Y and changing the logic state. Accordingly, this embodiment depicted in FIG. 13 has a reduced data rate performance as compared to the embodiment depicted in FIG. 12. Also, both the embodiments in FIGS. 12-13 can be followed by a CML buffer 204 to boost the current drive capability of demultiplexer 202.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit of the disclosure. Furthermore, it should also be understood that the features or characteristics of any embodiment described or depicted herein can be combined, mixed or exchanged with any other embodiment.

What is claimed is:

1. A circuit, comprising:
    a first section comprising a plurality of transistors configured to compare the phase of a data stream with the phase of a delayed local clock signal and output a control voltage corresponding to the difference in phase between the data stream and the delayed local clock signal;
    a clock generator configured to generate a local clock signal;
    a variable delay line coupled between the clock generator and the first section, the variable delay line comprising a plurality of variable impedance LC subcircuits responsive to the control voltage, wherein the local clock signal from the clock generator propagates along the variable delay line from the clock generator to the first section, and the variable delay line is configured to delay the local clock signal by an amount corresponding to the control voltage, thereby producing the delayed local clock signal, wherein the delayed local clock signal comprises a first clock signal and a second clock signal.

2. The circuit of claim 1, wherein the variable delay line comprises a transmission line, a portion of the transmission line providing the inductive portion of each LC subcircuit, and a plurality of variable capacitors coupled with the transmission line, each variable being responsive to the control voltage and providing the capactive portion of the LC subcircuit.

3. The circuit of claim 2, wherein each variable capacitor comprises a P-type transistor having a source and drain coupled with each other and the transmission line, and a gate coupled with a node for providing the control voltage to the transistor.

4. The circuit of claim 1 wherein each LC subcircuit comprises an inductor coupled with a variable capacitor, the capacitance of the variable capacitor being variable by the control voltage.

5. The circuit of claim 4, wherein the inductor from each LC subcircuit is serially connected.

6. The circuit of claim 1, wherein each LC subcircuit comprises a capacitor coupled with a variable inductor, the inductance of the variable inductor being variable by the control voltage.

7. The circuit of claim 1, wherein the first section comprises a half-rate phase detector configured to compare the phase of the incoming data stream with the first clock signal and the second clock signal, the second clock signal being out of phase with the first clock signal; and a charge pump coupled with the phase detector.

8. The circuit of claim 1, wherein the first and second clock signals are substantially 180 degrees out of phase.

9. The circuit of claim 1, wherein the half-rate phase detector comprises:
 a first exclusive-OR (XOR) gate configured to output a first XOR output signal representative of an XOR comparison between the data and the first clock signal; and
 a second exclusive-OR (XOR) gate configured to output a second XOR output signal representative of an XOR comparison between the data and the second clock signal.

10. The circuit of claim 9, wherein the half-rate phase detector comprises a first and a second integrator coupled with a first and a second output of the first and second XOR gates, respectively.

11. The circuit of claim 9, wherein the first and second XOR gates are further configured to low pass filter the first and second XOR output signals, respectively.

12. The circuit of claim 1, wherein the first section and variable delay line are configured to continuously compare data with the delayed clock signals to maintain a substantial alignment of the clock signals with the data stream.

13. The circuit of claim 12, further comprising a demultiplexer configured to demultiplex the data stream into two separate data streams at a reduced data rate using the substantially aligned local clock signals.

14. The circuit of claim 13, comprising a plurality of cascaded tapered current mode logic (CML) buffers configured to increase the amplitude of the aligned clock signals and separated data streams.

15. The circuit of claim 13, wherein the demultiplexer comprises a concatenation of at least two stages, each stage comprising two latches.

16. The circuit of claim 15, wherein the first stage comprises:
 a first latch configured to latch the data stream with the first clock signal and output a first latched signal; and
 a second latch configured to latch the data stream with the second clock signal and output a second latched signal.

17. The circuit of claim 16, wherein the second stage comprises:
 a third latch configured to latch the first latched signal with the second clock signal and output a third latched signal; and
 a second latch configured to latch the second latched signal with the first clock signal and output a fourth latched signal.

18. The circuit of claim 15, wherein each latch comprises:
 a track circuit comprising a differential pair of transistors and a first current tail transistor, wherein the gates of each transistor in the differential pair are coupled with a first input;
 a latch circuit coupled with the track circuit and comprising a cross-coupled pair of transistors and a second current tail transistor, wherein the sources of each transistor in the cross-coupled pair are coupled with a latch output and the sources of the differential transistors in track circuit; and
 a track control circuit coupled with the track circuit and having a second input, wherein the track control circuit is configured to enable the track circuit when the signal provided to the second input is at a first predetermined logic state such that the latch output tracks the first input, and further wherein the track control circuit is configured to disable the track circuit when the signal provided to the second input is at a second predetermined logic state.

* * * * *